(12) United States Patent
Weeber et al.

(10) Patent No.: US 8,929,078 B2
(45) Date of Patent: Jan. 6, 2015

(54) ELECTRONIC CONTROL DEVICE

(75) Inventors: Volker Weeber, Lauffen A. N. (DE);
Heinrich Barth, Leonberg (DE); Ralph Schertlen, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 330 days.

(21) Appl. No.: 13/514,705

(22) PCT Filed: Nov. 25, 2010

(86) PCT No.: PCT/EP2010/068171
§ 371 (c)(1),
(2), (4) Date: Aug. 17, 2012

(87) PCT Pub. No.: WO2011/069828
PCT Pub. Date: Jun. 16, 2011

(65) Prior Publication Data
US 2012/0300405 A1   Nov. 29, 2012

(30) Foreign Application Priority Data

Dec. 10, 2009  (DE) .................. 10 2009 054 517

(51) Int. Cl.
*H05K 7/20* (2006.01)
*H05K 9/00* (2006.01)
*H01L 23/552* (2006.01)
*H01L 25/16* (2006.01)

(52) U.S. Cl.
CPC ............ *H05K 9/0022* (2013.01); *H01L 23/552* (2013.01); *H05K 7/20418* (2013.01); *H05K 7/20854* (2013.01); *H01L 25/16* (2013.01); *H01L 2924/0002* (2013.01)
USPC ........... 361/714; 361/704; 361/707; 361/709; 361/712; 361/717; 361/718; 361/719; 361/720; 165/80.3

(58) Field of Classification Search
USPC .................................. 361/704, 707
See application file for complete search history.

(56) References Cited

U.S. PATENT DOCUMENTS 5,815,371 A * 9/1998 Jeffries et al. ................ 361/704
5,973,923 A * 10/1999 Jitaru ............................ 361/704
6,049,469 A * 4/2000 Hood et al. ................... 361/818

(Continued)

FOREIGN PATENT DOCUMENTS

| | | |
|---|---|---|
| CN | 1539167 | 10/2004 |
| CN | 101150123 | 3/2008 |
| DE | 4317469 | 12/1994 |
| EP | 0866648 | 9/1998 |

OTHER PUBLICATIONS

PCT/EP2010/068171 International Search Report dated Mar. 14, 2011 (Translation and Original, 4 pages).

*Primary Examiner* — Boris Chervinsky
(74) *Attorney, Agent, or Firm* — Michael Best & Friedrich LLP

(57) ABSTRACT

The invention relates to an electronic control device (10) having electronic components (160, 162) on a circuit board (110) which are shielded from electrical and/or magnetic interference fields. According to the invention, an electrically conductive sheet metal part (170) is arranged on the circuit board (110) which forms a Faraday cage for the electronic components (160, 162) with the circuit board. The electrically conductive sheet metal part (170) is furthermore in thermal contact to the electronic components (160, 162) and in thermal contact to the housing (100) of the control device (10) and thereby deflects heat from the electronic components (160, 162) into the housing (100).

8 Claims, 6 Drawing Sheets

(56) References Cited

U.S. PATENT DOCUMENTS

| | | | |
|---|---|---|---|
| 6,367,263 B1 * | 4/2002 | Scott | 62/6 |
| 6,562,655 B1 * | 5/2003 | Glenn et al. | 438/106 |
| 6,570,086 B1 | 5/2003 | Shimoji et al. | |
| 6,740,959 B2 | 5/2004 | Alcoe et al. | |
| 7,050,305 B2 * | 5/2006 | Thorum | 361/719 |
| 7,053,295 B2 * | 5/2006 | Murasawa | 174/377 |
| 7,082,033 B1 | 7/2006 | Akram | |
| 7,368,666 B2 * | 5/2008 | Takeda | 174/260 |
| 7,999,394 B2 * | 8/2011 | Too et al. | 257/779 |
| 8,081,476 B2 * | 12/2011 | Tsao et al. | 361/719 |
| 2008/0062668 A1 | 3/2008 | Kakinoki et al. | |
| 2008/0310114 A1 * | 12/2008 | Pawlenko et al. | 361/704 |
| 2009/0002949 A1 | 1/2009 | Pawlenko et al. | |
| 2009/0146269 A1 | 6/2009 | Chow et al. | |

* cited by examiner

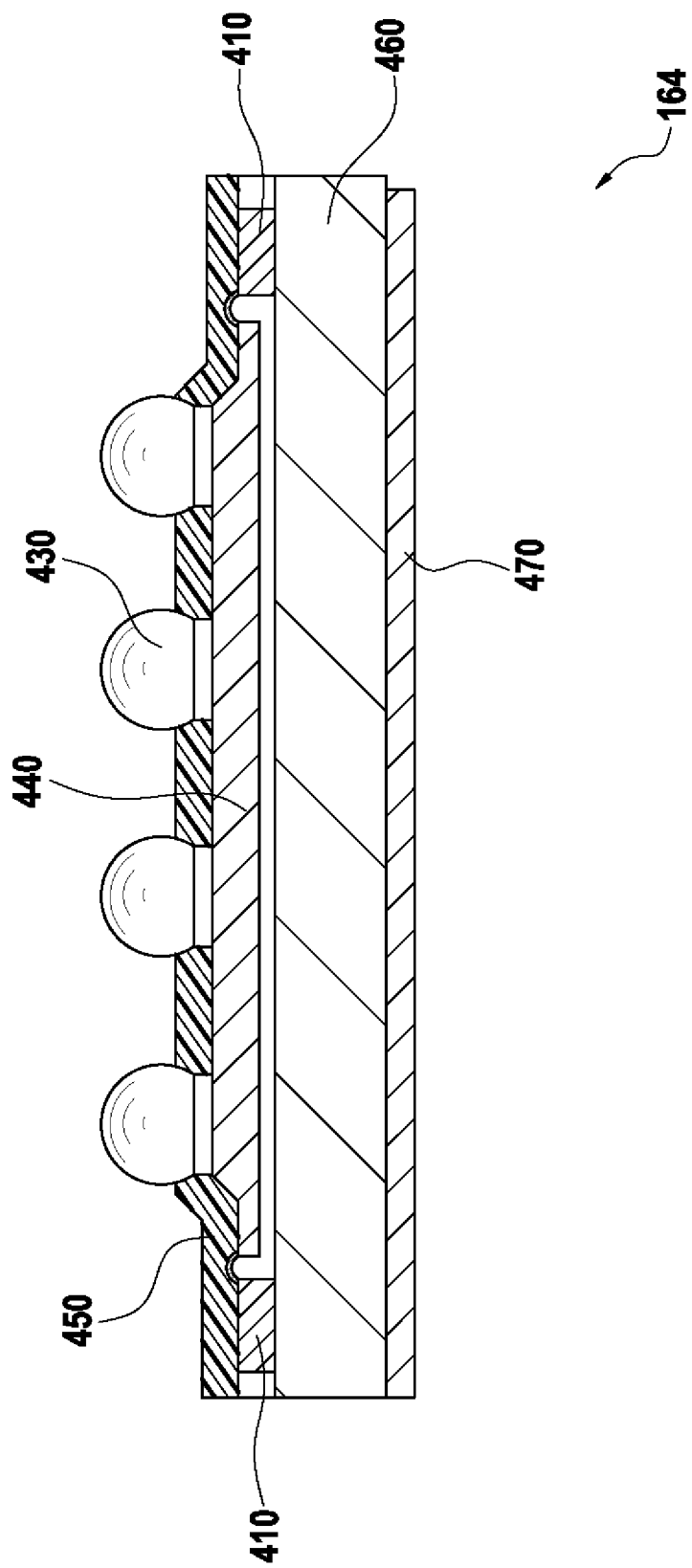

US 8,929,078 B2

ELECTRONIC CONTROL DEVICE

BACKGROUND OF THE INVENTION

The invention relates to a control device for providing electrical and/or magnetic shielding. Such devices are known in a variety of embodiments and for various applications. The problem of shielding electronic components from electrical and/or magnetic fields occurs in many areas when using such control devices. It is therefore necessary to protect the electronic circuit, parts thereof or also only individual components from electrical and/or magnetic stray radiation. It can similarly be necessary not to allow stray radiation originating in an electronic circuit to travel to the outside. It can also be further necessary to protect interference-sensitive components of the circuit from the radiation of interference emitting components of this circuit. Particularly control devices in motor vehicles have to therefore be improved with respect to the electromagnetic compatibility (EMC) thereof.

The German patent publication DE 43 17 469 A1 discloses a control device, in which individual circuit components or the entire circuit is covered with a closed shielding box. Such a shielding is however complex and requires large volumes within the control device.

SUMMARY OF THE INVENTION

The control device according to the invention solves the problem of shielding from electrical and/or magnetic fields by the use of one or a plurality of electrically conductive shielding elements, which in each case together with the circuit board and possibly further components form a Faraday cage around the entire circuit, groups of components or individual components. By a Faraday cage, a casing closed to all sides or provided with openings is understood, the interior of which is shielded at low frequencies from external electrical fields or electromagnetic waves. For that purpose, an electrically conductive shielding element is manufactured, for example, from sheet metal or wire mesh. Such an electrically conductive shielding element is simple and cost effective to manufacture and to install and requires little space within the housing, and therefore a small and compact design is possible.

The electrically conductive shielding element is preferably designed as an electrically conductive sheet metal part, in particular as a deep-drawn part, and has, for example, a bonnet- or pot-shaped form. Said shielding element is preferably mounted to a metal frame, which is arranged on the circuit board and surrounds the components or component groups which are shielded by the electrically conductive sheet metal part.

In a particularly preferred embodiment of the invention, the electrically conductive shielding element fulfills still another function in addition to the shielding effect thereof. For example, the electrically conductive shielding element can serve to cool power components or to provide ground potential. In a particularly preferred embodiment, the electrically conductive shielding element fulfills several of these functions.

In circuits currently used for control devices, components in the so-called wafer level package design or flip-chip design are used. In order to prevent malfunctions of these components due to parasitic substrate currents, ground potential should be applied to the backside of the respective component in order to minimize potential shifts within the component. In order to facilitate the connection to ground potential, such components can have a metallic layer on the backside thereof. By a corresponding connection of the electrically conductive shielding element, on the one hand to this backside metallization of the component and on the other hand to ground potential, for example by means of corresponding contacts on the circuit board, the ground connection of the wafer level package component can be simply ensured without additional expense and effort. If the component does not have any backside metallization, the ground contact can nevertheless be made by means of a connection of the backside of the component to the electrically conductive shielding element which is as extensive as possible.

A further problem, especially in the case of a small, compact design, is the cooling of power components. The electrically conductive shielding element is therefore preferably formed in such a way that said element is in thermal contact to at least one power component and in thermal contact to the surrounding housing or to cooling devices mounted to said housing. For that reason, the electrically conductive shielding element preferably rests against said housing and further comprises recesses or raised sections, which correspond in their position to the position of one or several power components and are pressed against said power components. The heat is deflected from the electrically conductive shielding element to the housing. In so doing, no additional cooling elements or heat transfer elements are necessary on the circuit board.

In order to achieve as effective a heat dissipation as possible, the contact surfaces between the electrically conductive shielding element and the associated power component and between said electrically conductive shielding element and the housing are designed as large as possible. Such a cooling is then particularly very effective if at least one power component is on hand in the so-called slug up design. Such a component has a metal element on the side thereof facing away from the circuit board. Said metal element deflects the heat from the inside of the component to the surface thereof, where the heat is absorbed by the electrically conductive shielding element. For that reason, said electrically conductive shielding element preferably consists of a material which in addition to the electrical conductivity thereof also has a high heat capacity and a high thermal conductivity. Suitable materials are, for example, copper or aluminum.

BRIEF DESCRIPTION OF THE DRAWINGS

FIG. 4 shows a detailed cut-out from FIG. 1.

DETAILED DESCRIPTION

Figure 1:
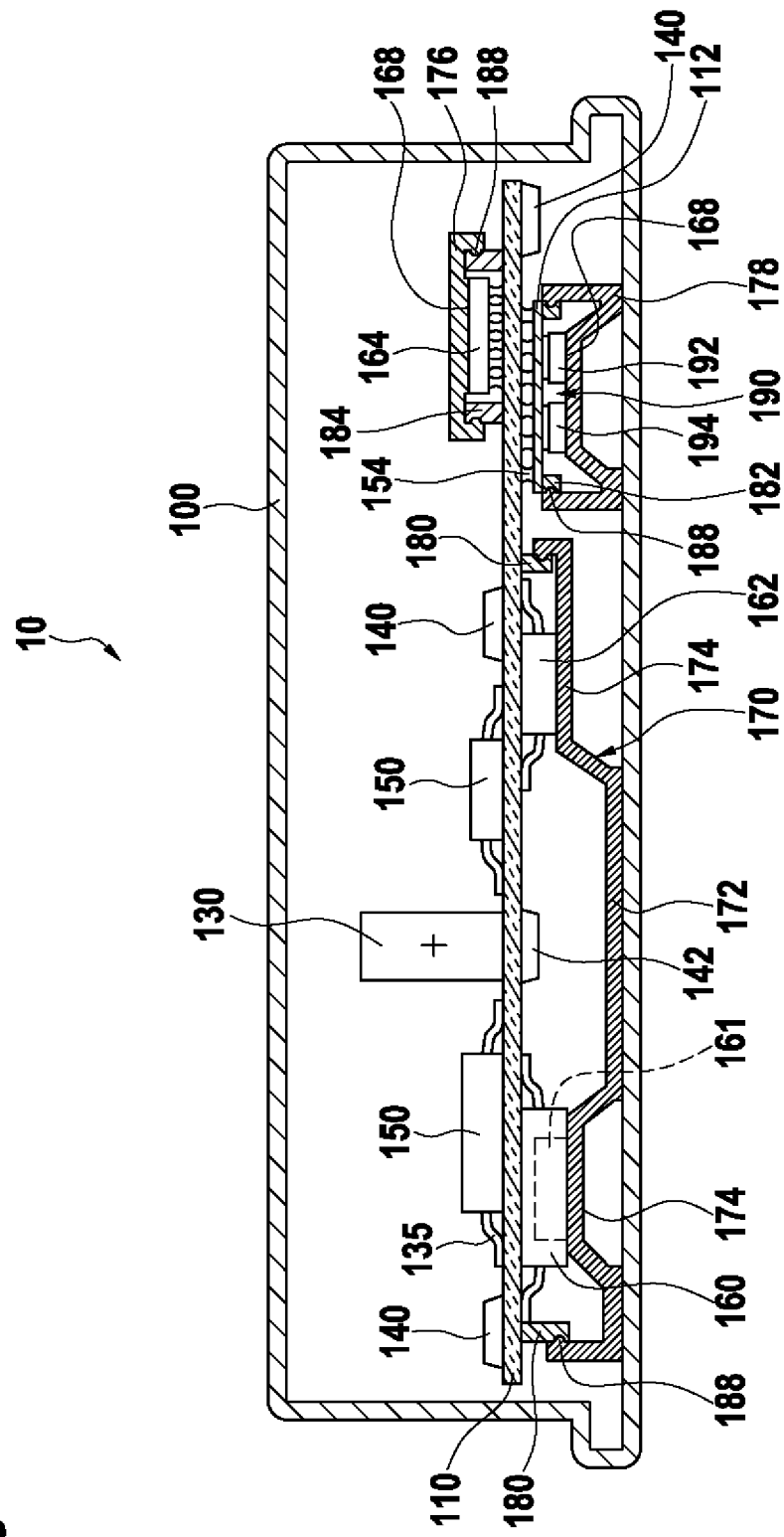
FIG. 1 shows a sectional view through a control device according to a first exemplary embodiment of the invention.

A housing 100 for a control device 10 is depicted in FIG. 1, which in this example is made from metal. The housing 100 is self-contained due to at least one cover or plug that is not depicted. A circuit board 110 is disposed in the housing 100. In this exemplary embodiment, the circuit board 110 is equipped with electrical and/or electronic components on both sides. In this case, the electrical and/or electronic components can relate, for example, to passive components, such as the capacitor 130 or resistors 140, 142, or to active components, for example the power components 150, 160, 162,

164, 192, 194. The components are, for example, contacted to the conducting paths running on the circuit board, which are not visible in the drawing, by means of lateral connections 135 or by balls of solder 154 or are connected to the circuit board, as in the example of the capacitor 130, via through connections that are not depicted.

A capacitor 130, resistors 140 as well as power components 150 are disposed on the top surface of the circuit board. The power components 150 have only a low power output and therefore generate only a small amount of heat. A component 164 is further disposed on the top surface of the circuit board 110, said component being constructed in a wafer level package design and being described in more detail pursuant to FIG. 4.

FIG. 4 depicts the electronic component 164, which is constructed in wafer level package design. The central element of the component 164 is the chip 460. In order to contact toward the outside, solder balls 430 are arranged on the surface of the chip facing the circuit board, said solder balls being conductively connected to connection points 410 on the chip 460 via a contact layer 440. In order to electrically insulate the contact layer 440, a polymer layer 450 is disposed on said contact layer 440. The backside of the chip 460 is provided with a metallic layer 470, the so-called backside metallization. For the functionality of the component 164, it may be necessary for the backside metallization to be at ground potential because otherwise parasitic currents in the substrate of the chip 460 can lead to a malfunction in the circuit.

Different electrical and/or electronic components 142, 160, 162, 190 are likewise disposed on the bottom side of the circuit board 110. The components 160, 162, 192 and 194 relate to power components with a high power output and a correspondingly higher heat generation. The power component 160 is in this example constructed in the so-called slug up design. Said power component comprises a metal platelet 161, a so-called heat slug on the side thereof facing away from the circuit board 110. Said heat slug serves to deflect heat from the inside of said power component 160 to the surface thereof. The power components 160 and 162 as well as the passive component 142 constitute a group of components. In this example, this group must be shielded from electrical and/or magnetic interference fields.

A so-called module 190, also referred to as multi-chip module (MCM), is likewise disposed on the bottom side of the circuit board 110. Such a module is generally understood to be a small, circuit board equipped with components, which, for example, can be disposed on a larger circuit board and contacted with the same via solder balls. In the present example, the module 190 consists of a circuit board 112, which is configured smaller and thinner than the circuit board 110 and on which two power components 192 and 194 are disposed. The power components 192 and 194 are constructed in wafer level package design. The module 190 is contacted to the circuit board 110 via solder balls 154.

A metal frame 180 is disposed on the bottom side of the circuit board 110, which surrounds the component group consisting of the power components 160 and 162 and the passive component 142. An electrically conductive sheet metal part 170 is mounted to the metal frame 180 by means of a snap connection 188. In so doing, the metal frame or the electrically conductive sheet metal part 170 has a circumferential groove, in which an extension mounted to the respective other part engages in the manner of a tongue and groove connection; thus enabling the electrically conductive sheet metal part 170 to be fixed to the metal frame 180.

The metal frame 180, the electrically conductive sheet metal part 170 and the circuit board 110 form together a Faraday cage for the components 160, 162 and 142, whereby an effective shielding from electrical and/or magnetic interference fields results for these components 160, 162 and 142. The electrically conductive sheet metal part 170 serves thereby as the shielding element. As an alternative to a snap connection, the connection between the metal frame 180 and the electrically conductive sheet metal part 170 can also, for example, be made by welding or soldering.

In order to additionally achieve a reliable and space saving cooling of the power components 160 and 162, regions 174 are configured on the electrically conductive sheet metal part 170 which are in thermal contact with the power components as well as regions 172 which are in thermal contact with the housing 100. Heat originating in the power components 160 is thereby absorbed and disseminated by the electrically conductive sheet metal part 170 and deflected to the housing 100. In order to do this, said electrically conductive sheet metal part 170 is designed as a deep-drawn part, which has flat regions 172, which rest against said housing 100. Recesses 174 in said electrically conductive sheet metal part 170 are disposed so as to correspond to the positions of the power components 160 and 162. Said recesses are likewise of flat design and rest against the surfaces of said power components 160 and 162.

An electrically conductive metal frame 184, which surrounds the component 164, is disposed on the surface of the circuit board 110. An electrically conductive sheet metal part 176 is mounted on the metal frame 184. This mounting takes place via a snap connection 188 and is therefore electrically conductive. As an alternative to a snap connection, the connection between the metal frame 184 and the electrically conductive sheet metal part 176 can also be made by welding or soldering. Said metal frame 184, said electrically conductive sheet metal part 176 and said circuit board 110 together form a Faraday cage for the component 164, whereby an effective shielding from electrical and/or magnetic interference fields results. Said electrically conductive sheet metal part 176 thereby serves as the shielding element. The component 164 is constructed in a wafer level package design and has a backside metallization 168 on the side thereof facing away from said circuit board 110. The backside metallization 168 is in conductive electrical contact with said electrically conductive sheet metal part 176. Said metal frame 184 and thereby also said electrically conductive sheet metal part 176 are connected to ground potential. Ground potential is therefore also applied to the backside metallization 168 of the component 164, whereby undesirable potential shifts in the substrate of the component 164 are minimized. Because said electrically conductive sheet metal part 176 is not in thermal contact with the housing 100, a deflection of heat from the component 164 to the housing does not occur in this case.

A conductive metal frame 182 is likewise disposed on the circuit board 112 on the bottom side of the circuit board 110. An electrically conductive sheet metal part 178 is mounted on the metal frame 182 by means of a snap connection 188. As an alternative to a snap connection, the connection between the metal frame 182 and the electrically conductive sheet metal part 178 can also be made by welding or soldering. Said metal frame 182, said electrically conductive sheet metal part 178 and the small circuit board 112 together form a Faraday cage for the components 192 and 194, whereby an effective shielding from electrical and/or magnetic interference fields results for these components. Said electrically conductive sheet metal part 178 thereby serves as the shielding element. Said metal frame 182 is connected to ground potential via the small circuit board 112. Said electrically conductive sheet metal part 178 is formed such that it rests in the central region thereof against the two components 192 and 194 and thereby makes the ground contact for the backside metallization 168 of the component 192 as well as being in thermal contact to the two components 192 and 194. Said electrically conductive sheet metal part 178 is configured in cross section approximately V-shaped in the edge region thereof and is in thermal contact to the housing 100. Heat originating in the power components 192 and 194 is thereby absorbed and disseminated by the electrically conductive sheet metal part 178 and deflected to the housing 100. In so doing, said electrically conductive sheet metal part 178 combines the functions of shielding from electrical and/or magnetic fields, cooling of power components and providing the ground connection of a backside metallization.

Figure 2:
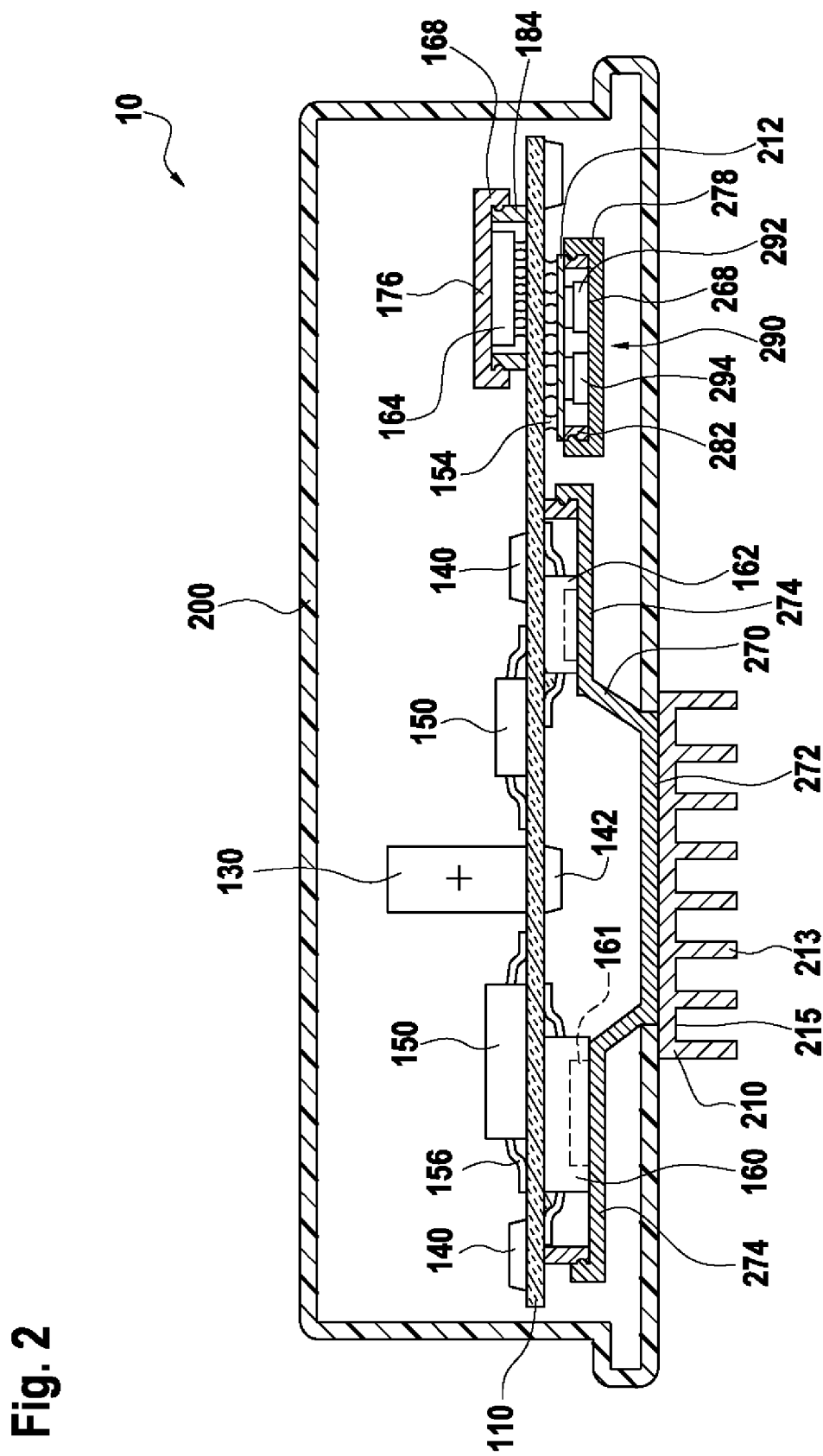
FIG. 2 shows a sectional view through a control device according to a second exemplary embodiment of the invention.

A second exemplary embodiment of the invention is depicted in FIG. 2. The design substantially corresponds to the example from FIG. 1. Identical components are labeled with the identical reference numerals. The housing 200 consists of plastic material in this example. Said housing has an opening 215 on the bottom side thereof, which is covered by a metallic heat sink 210. The heat sink 210 comprises in a known manner cooling ribs 213. In order to achieve an effective cooling of the power components which have high power output 160 and 162 and are disposed in the housing 200, the opening 215 and thereby also the heat sink 210 are disposed in direct proximity to said power components 160 and 162.

In contrast to FIG. 1, the cooling of the power components 160 and 162 takes place via an electrically conductive sheet metal part 270 which is in thermal contact to said power components 160 and 162 and is in thermal contact to the heat sink 210. In order to do this, the electrically conductive sheet metal part 270 is configured as a deep-drawn part, which has flat regions 274 that rest against said power components 160 and 162. A raised section 272 is disposed on said electrically conductive sheet metal part 270 so as to correspond to the position of the heat sink. Said raised section is also of flat design and rests against said heat sink 210.

Similar to FIG. 1, a module 290 is disposed in the housing 200. The module comprises a circuit board 212, on which two power components 290 and 292 are disposed. A conductive metal frame 282 is disposed on the circuit board 212. An electrically conductive sheet metal part 278 is mounted on the metal frame 282. Said metal frame 282, said electrically conductive sheet metal part 278 and the small circuit board 212 together form a Faraday cage for the components 290 and 292. Said metal frame 282 is further connected to ground potential via the circuit board 212. Said electrically conductive sheet metal part 278 rests against the two components 292 and 294 and thereby establishes ground contact for the backside metallization 268 of the component 292. In contrast to FIG. 1, the power components 292 and 294 relate to power components having lower power output so that a cooling at a heat sink via the electrically conductive sheet metal part 278 is not necessary. It is sufficient that the heat is emitted to the inside of the housing 200.

In FIG. 3, three exemplary embodiments for inventive, electrically conductive shielding elements, which are embodied as sheet metal parts, are depicted in each case in a top view and a cross sectional view.

Figure 3A:
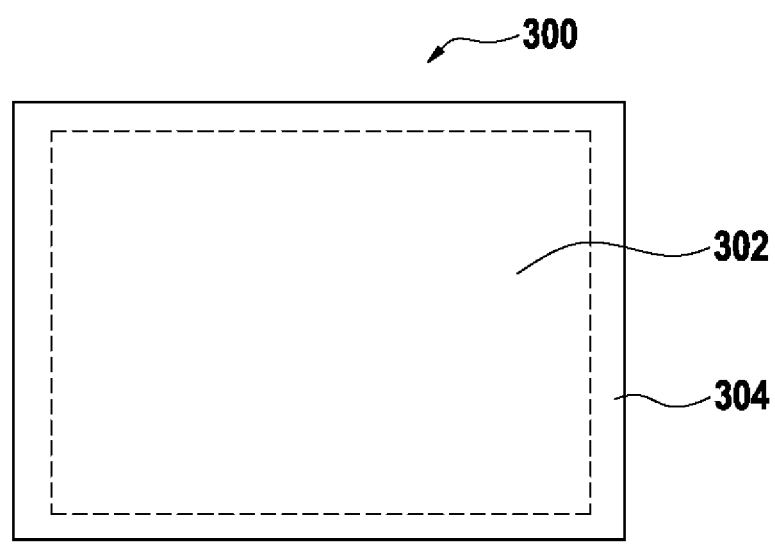
FIGS. 3a-c show in each case a sectional view and a top view of exemplary embodiments for electrically conductive shielding elements.
Figure 3A:
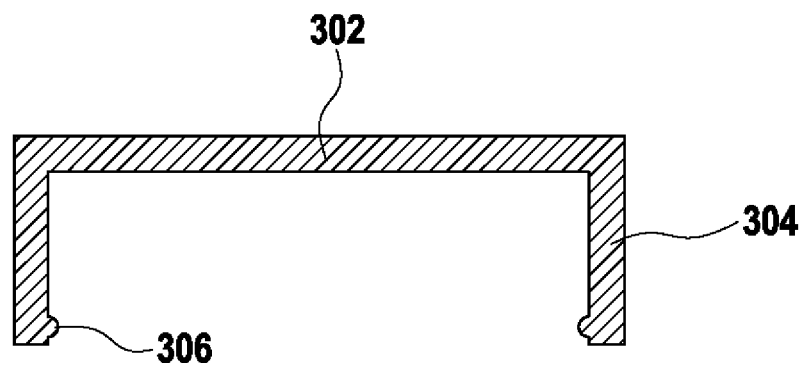

FIG. 3a shows a very simply constructed electrically conductive sheet metal part 300. Said sheet metal part is designed substantially pot-shaped and has a flat cover region 302 and an edge region 304, which is configured substantially perpendicularly to the cover region and extends around said cover region 302. The edge region has a circumferential extension, which can be used for a snap connection.

Figure 3B:
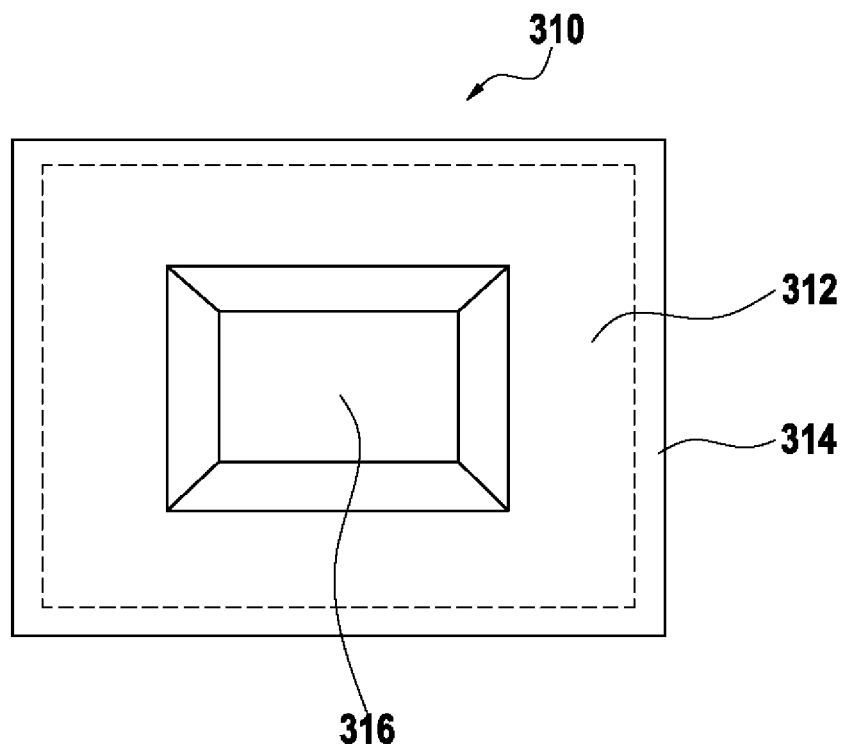
Figure 3B:
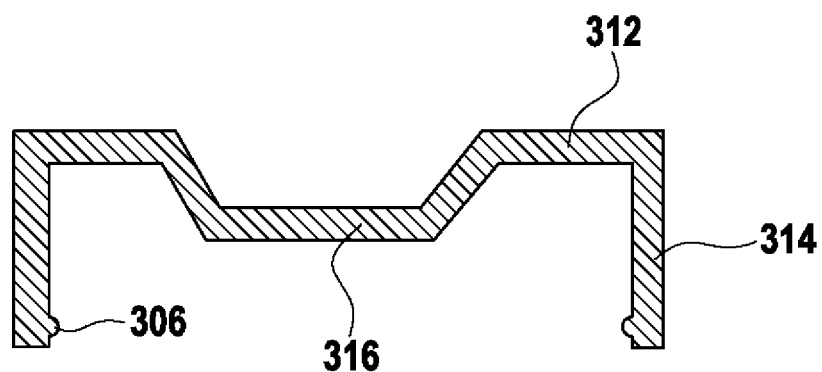

FIG. 3b shows a further example for an electrically conductive sheet metal part 310. Said sheet metal part has a cover region 312 as well as a circumferential edge region 314 configured perpendicularly to the cover region. The edge region 314 has a circumferential extension 306, which can be used for a snap connection. The cover region 312 is structured and has a recess 316. This recess is suited for establishing a thermal and/or electrically conductive contact to one or several electronic components disposed below it.

Figure 3C:
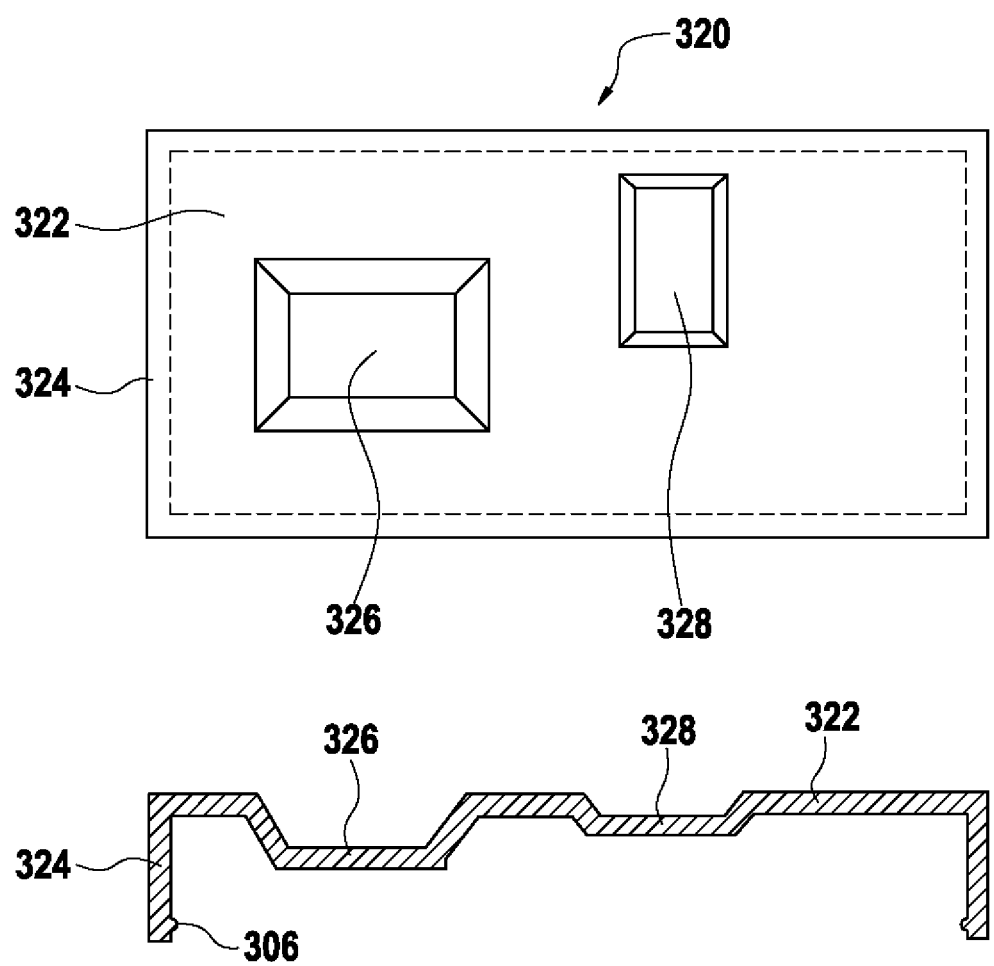

FIG. 3c shows a development of the example from FIG. 3b. The electrically conductive sheet metal part 320 depicted has a cover region 322 as well as a circumferential edge region 324 configured perpendicularly to the cover region. The edge region 324 has a circumferential extension 306, which can be used for a snap connection. The cover region 322 is structured and has two recesses 326 and 328. This recess is suited to establishing a thermal and/or conductive contact to in each case one or several components disposed below it. The recesses 326 and 328 have different depths and are disposed offset to one another. The respective depth and position is adapted to the installation height and the position of the associated electronic components.

The recesses in FIGS. 3b and 3c are designed as flat as possible in order to ensure a large contact surface between the electrically conductive sheet metal part and the electronic components disposed below the same. The recesses are designed rectangularly in the examples shown; however, any other form is likewise conceivable, e.g. round, elliptical or L-shaped. Additionally or alternatively, raised sections instead of recesses may be provided. The thermal contact can be ensured by means of tangency or by a thermal conductivity medium, as, for example, a thermal conductance paste.

The invention claimed is:

1. An electronic control device comprising a housing, in which at least one circuit board is disposed, wherein at least one electronic component is disposed on the circuit board, wherein the electronic control device has means for shielding from electrical and/or magnetic fields, wherein the means for shielding from electrical and/or magnetic fields comprises at least one electrically conductive shielding element which is disposed such that at least the electrically conductive shielding element and the circuit board form a Faraday cage for at least one associated electronic component and wherein the electrically conductive shielding element is connected to a ground potential, wherein at least one electronic component with the backside thereof, which particularly comprises a backside metallization, is in conductive contact with the at least one electrically conductive shielding element.

2. The electronic control device according to claim 1, wherein at least one metal frame is disposed around at least one electronic component, the electrically conductive shielding element being mounted to said metal frame.

3. The electronic control device according to claim 1, wherein at least one electrically conductive shielding element is mounted by means of a snap connection or is soldered or welded.

4. The electronic control device according to claim 1, wherein the housing has an opening which is closed by a heat sink disposed at said housing.

5. The electronic control device according to claim 1, wherein the electrically conductive shielding element comprises at least one first region, which is in thermal contact to the housing or to a heat sink disposed at said housing, and comprises at least one second region, which is in thermal contact to at least one associated power component.

6. The electronic control device according to claim 5, wherein the second regions are configured as recesses or raised sections, the positions of which correspond to the positions of the power components on the circuit board associated with said second regions.

7. The electronic control unit according to claim 5, wherein the second regions correspond to the respective installation heights of the associated power components.

8. The electronic control unit according to claim 1, wherein at least one power component has a heat slug element on the side thereof facing away from the circuit board.

* * * * *